United States Patent [19]

Kawahara et al.

[11] Patent Number: 5,386,394
[45] Date of Patent: Jan. 31, 1995

[54] SEMICONDUCTOR MEMORY DEVICE FOR PERFORMING PARALLEL OPERATIONS ON HIERARCHICAL DATA LINES

[75] Inventors: Takayuki Kawahara, Hachioji; Masakazu Aoki, Tokorozawa; Yoshinobu Nakagome, Hamura; Makoto Hanawa, Niiza; Kunio Uchiyama, Kodaira; Masayuki Nakamura, Akishima; Goro Kitsukawa, Tokyo; Kanji Oishi, Koganei, all of Japan

[73] Assignee: Hitachi, Ltd., Tokyo, Japan

[21] Appl. No.: 114,633

[22] Filed: Sep. 2, 1993

[30] Foreign Application Priority Data

Sep. 3, 1992 [JP] Japan .................. 4-235634
Oct. 29, 1992 [JP] Japan .................. 4-291165

[51] Int. Cl.⁶ .................. G11C 7/00; G11C 11/40
[52] U.S. Cl. .................. 365/208; 365/207; 365/51; 365/230.01; 365/230.03
[58] Field of Search .................. 365/207, 203, 208, 51, 365/63, 230.03, 230.01

[56] References Cited

U.S. PATENT DOCUMENTS

| | | | |
|---|---|---|---|
| 4,777,625 | 10/1988 | Sakui | 365/207 |
| 4,819,207 | 4/1989 | Sakui | 365/207 X |
| 4,888,732 | 12/1989 | Inoue | 365/51 |
| 5,051,954 | 9/1991 | Toda | 365/230.3 X |
| 5,060,230 | 10/1991 | Arimoto | 365/201 X |
| 5,245,570 | 9/1993 | Fazio | 365/230.3 X |
| 5,274,598 | 12/1993 | Fujii | 365/207 X |

FOREIGN PATENT DOCUMENTS

| | | |
|---|---|---|
| 57-198592 | 12/1982 | Japan . |
| 59-19291 | 1/1984 | Japan . |
| 4-53083 | 2/1992 | Japan . |
| 02590 | 4/1991 | WIPO . |

*Primary Examiner*—Eugene R. LaRoche
*Assistant Examiner*—Son Mai
*Attorney, Agent, or Firm*—Antonelli, Terry, Stout & Kraus

[57] ABSTRACT

The semiconductor device has more-significant global data lines and less-significant data lines hierarchically formed, and switches for controlling the more-significant global data lines and the less-significant data lines to be connected each other. In addition, the semiconductor device has the unit for precharging the global data lines independently of the data lines.

16 Claims, 14 Drawing Sheets

F I G. 21
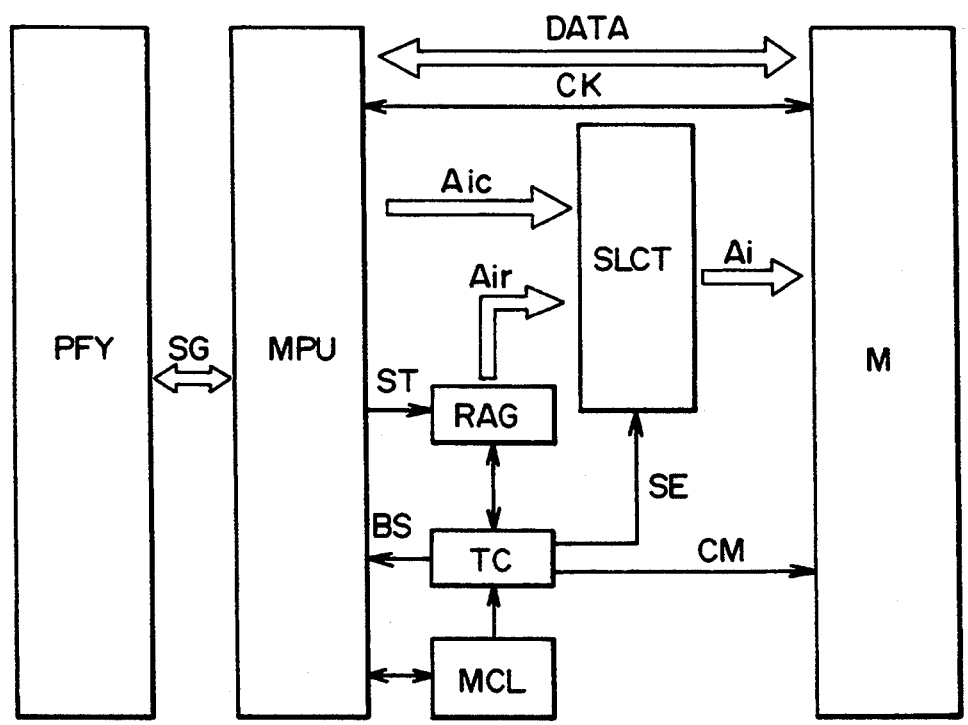

SEMICONDUCTOR MEMORY DEVICE FOR PERFORMING PARALLEL OPERATIONS ON HIERARCHICAL DATA LINES

BACKGROUND OF THE INVENTION

This invention relates to semiconductor devices such as a dynamic random access memory (DRAM), and particularly to a circuit arrangement for realizing cache memories on the same chip and the technique for the high speed, small surface and low consumption.

In claims 88 through 90 of the international application number PCT/US91/02590, it is described that the sense amplifier of DRAM is used as a cache memory. In Japanese Patent Publication No. 2-043279 and No. 3-021996, it is also described that data lines are hierarchically formed for small area and high speed. Moreover, as described in FIGS. 4 through 8 of Japanese Patent Laid-open Gazette No. 4-053083, data lines are hierarchically formed for small area, amplifiers and/or switches of only n-channel MOS transistors (hereinafter, referred to as nMOST) are provided on normal data lines, and amplifiers of p-channel MOS transistors (hereinafter, referred to as pMOST) and n-channel MOS transistors (hereinafter, referred to as nMOST) are provided on a small number of more-significant global data lines which are connected to a large number of normal data lines.

SUMMARY OF THE INVENTION

It is an object of the invention to provide a semiconductor device having memories capable of reading and writing at a high speed when a cache memory mishits.

It is another object of the invention to provide a semiconductor device having memories capable of reducing consumption current.

As described in claims 88 through 90 of the International Application Number PCT/US91/02590, the normal arrangement of the data lines and sense amplifiers of DRAM encounters with the following problem when the sense amplifier is used as a cache memory. When the sense amplifier is used as a cache memory, word lines are left selected as in the page mode of the conventional DRAM. Thus, if the address specified at a certain cycle does not coincide with the address of data read on the sense amplifier at the previous cycle (at the time of mishitting), the word line must first be released from the selected state, and then the differential signals to the sense amplifier must be short-circuited. Thereafter, the word line is turned on and a signal is read from the memory cells. Therefore, at this time a long time is required for the access. In addition, upon writing, much time is taken at the mishitting time for the same reason.

When data lines are hierarchically formed as described in Japanese Patent Publication No. 2-043279, No. 3-021996 and No. 4-053083, the following problem is caused. A word line is selected for reading, a signal appears on the corresponding data line. In addition, a signal corresponding to this data line signal appears on a global data line, and fed to the following output circuit. A large number of data lines and global data lines are operated when a single word line is selected. Therefore, the consumption current is increased due to the charging and discharging currents to and from the parasitic capacitance of the data lines and global data lines. Moreover, the means for using the hierarchically formed data lines as cache memories is not provided.

Thus, this invention is to provide a semiconductor device having low consumption current type memories capable of realizing high-speed reading and writing when a cache memory mishits.

According to this invention, data lines are hierarchically formed (Dmn, GDm and so on) as shown in FIG. 1, and main amplifiers (MAm) have provided therein means by which the global data lines (GDm, /GDm) are not short-circuited at the end of a certain read/write cycle and by which the main amplifiers (MAm) on the global data lines (GDm, /GDm) are used as cache memories as shown in FIG. 2. In other words, means (MAm) are provided for directly supplying data on the global data lines (GDm, /GDm) to the following output circuit (DF). In order to use the main amplifiers (MAm) as cache memories, there are provided means (PAmn) for short-circuiting the data lines (Dmn, /Dmn) independently of global data lines (GDm, /GDm), and means (MAm) for precharging the global data lines (GDm, /GDm) in parallel to the operation (decoding operation and turning on of word lines Wnk) for selection of memory cells MC. Also, the main amplifiers (MAm) and the following output circuit (DF) have provided therein means for continuously reading the signals appearing on the global data lines (GDm, /GDm) in synchronism with a clock signal (CK) common to all the system including the semiconductor device of the invention. In addition, the main amplifiers (MAm) has provided therein means for writing on the global data lines (GDm, /GDm) in synchronism with the common clock signal (CK), the means (PAmn) have provided therein means for writing the data previously written on the global data lines (GDm, /GDm) into the memory cells MC through data lines (Dmn, /Dmn), and the control means therefor is provided in a CON 1.

The means for using the global data lines (GDm, /GDm) or main amplifiers (MAm) as cache memories are provided in the main amplifiers MAm. The means (PAmn) for short-circuiting the data lines (Dmn, /Dmn) independently of the global data lines (GDm, /GDm) and the means (MAm) for precharging the global data lines (GDm, /GDm) in parallel with the operation of selecting memory cells MC are provided. By these means, it is possible to turn on the word lines (Wnk) and read the signal from the memory cells MC to appear on the data lines (Dmn, /Dmn). Thus, the access time at the cache mishitting time can be reduced unlike the conventional example described in the International Application Number PCT/US91/02590.

Since the means for using the global data lines (GDm, /GDm) or main amplifiers (MAm) as cache memories are provided, the global data lines (GDm, /GDm) are not necessary to be charged and discharged when the cache memories are hitted, and as a result the number of charging and discharging operations is decreased so that the consumption current can be reduced unlike the conventional examples described in Japanese Patent Publications No. 2-043279, No. 3-021996 and No. 4-053083.

Even when the global data lines (GDm, /GDm) or main amplifiers (MAm) are not used as cache memories, the number of charging and discharging the parasitic capacitance can be decreased and hence the consumption current can be reduced even at a high clock frequency unlike the conventional examples described in Japanese Patent Publication No. 3-021996 and Japanese Patent Laid-open Gazette 4-053083, since there is provided the means for continuously reading the signal once appearing on the global data lines (GDm, /GDm) in synchronism with the clock signal CK common to all the system.

Upon writing, since the means for first writing a signal on the global data lines (GDm, /GDm) is provided, the writing operation can be performed in parallel with the selection of word lines. Also, since data to be written comes just before the data lines (Dmn, /Dmn), it can be written at a high speed. Therefore, the high-speed writing operation can be always performed at the cache hitting and mishitting time unlike the conventional example described in the International Patent Number PCT/US91/02590.

According to this invention, since the means for precharging the global data lines independently of the data lines are provided, word lines can be selected in parallel with this precharging operation. Therefore, the access time at the mishitting time can be reduced when the main amplifiers are used as cache memories. In addition, since the means for using the global data lines and main amplifiers as cache memories are provided, the data lines and global data lines are not required to be charged and discharged at the cache hitting time, and hence the number of charging and discharging operations is decreased so that the consumption current can be reduced. Furthermore, since the means for continuously reading the signal appearing on the data lines is provided, the number of charging and discharging the parasitic capacitance of the global data lines is decreased and hence the consumption current can be reduced.

BRIEF DESCRIPTION OF THE DRAWINGS

FIG. 21 is a diagram of one example of the system arrangement using this invention.

DESCRIPTION OF THE PREFERRED EMBODIMENTS

Figure 1:
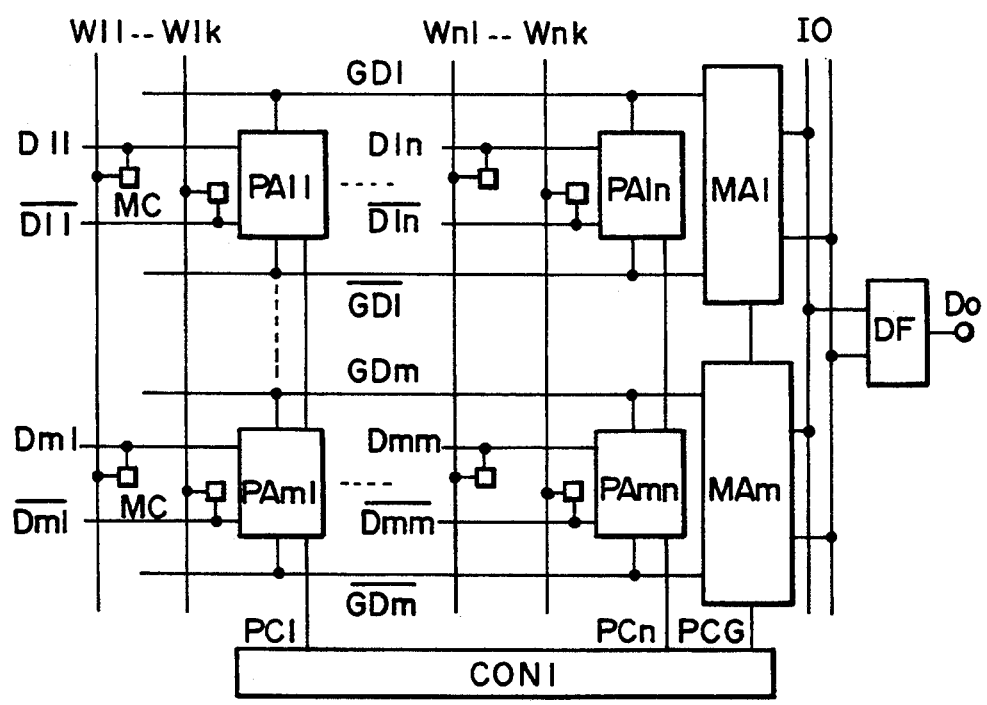
FIG. 1 is a diagram of a first embodiment of the invention.

A first embodiment of the invention will be described with reference to the accompanying drawings. Hereinafter, the reference numerals representing signals are also used for the signal lines and signal terminals unless otherwise mentioned. Moreover, in the drawings, the complementary signals represented by overlines added to the reference numeral or characters are added with a slash,"/", before the reference numerals or characters.

FIG. 1 is a diagram of the first embodiment of the invention. Referring to FIG. 1, there are shown pairs of data lines D11, /D11 through Dmn, /Dmn, pairs of global data lines GD1, /GD1 through GDm, /GDm, and word lines W11 through Wnk. There are also shown preamplifiers PA11 through PAmn which include the amplifier circuits for the pairs of data lines and the transfer circuits to the pairs of global data lines. Shown at MA1 through MAm are main amplifiers which include the amplifier circuits for the pairs of global data lines and the transfer circuits to the I O (input/output) lines connected to the output circuit DF. The preamplifiers PA11 through PAmn sometimes do not include the amplifier circuits for the pairs of data lines but serve simply as transfer circuits. When the main amplifiers MA1 through MAm and/or the pairs of global data lines GD1, /GD1 through GDm, /GDm are used as cache memories, there are provided means PA11 through PAmn and MA1 through MAm for short-circuiting the global data lines and the data lines independently of each other. In FIG. 1, the signals actuating the means for short-circuiting independently are indicated by PC1 through PCn for the pairs of data lines and by PCG for the pairs of global data lines. The means for generating these signals PC1 through PCn, PCG is represented by CON1. Although the signal PC1, for example, is used to actuate all means PA11 through PAm1 as illustrated, it can be considered that a part of these means is driven by PC1, and that the other part is driven by another signal. This applies to PCG. In addition, there are provided means for stopping the word line selection and the amplifying operation on the data lines and global data lines at the time of cache hitting. Here, the term, the hitting time means that the word to be selected by the address signal Ai at a certain cycle is coincident with the word selected at the previous cycle, and that information from a large number of memory cells on the word line is read on the main amplifiers MA1 through MAm and the global data lines GD1, /GD1 through GDm, /GDm. The mishitting time means that no such coincident is obtained and that no such information is read. The comparator circuit for detecting the address coincidence is formed on the same chip or another separate chip. The output circuit DF includes a circuit for converting the parallel output signals of the main amplifiers MA1 through MAm capable of producing parallel outputs into a serial form. In this embodiment, even if the cache memory is in the mishitting state, the operation of precharging the global data line can be performed in parallel with the operation of turning on the word line and reading a signal from the memory cells to data lines. In the prior art, the data lines are not hierarchically formed and the sense amplifiers are used as cache memories. Thus, if the cache memory mishits, the previous word line is released from the selected state, the data line is precharged and then a new word line is turned on. Therefore, this embodiment can operate at a higher speed. In addition, this embodiment continuously reads out the signal appearing on the global data line by use of the main amplifiers MA1 through MAm and output circuit DF in synchronism with the clock signal for the system not shown. Thus, this embodiment has the feature that since the number of times that the parasitic capacitances are charged and discharged is decreased, the consumption current can be reduced. Also, when the main amplifiers MA1 through MAm and/or the global data lines GD1, /GD1 through GDm, /GDm are used as cache memories, the data lines and global data lines are not required at the cache hitting time, and thus the number of times of charging and discharging is decreased so that the consumption current can be reduced.

Figure 2:
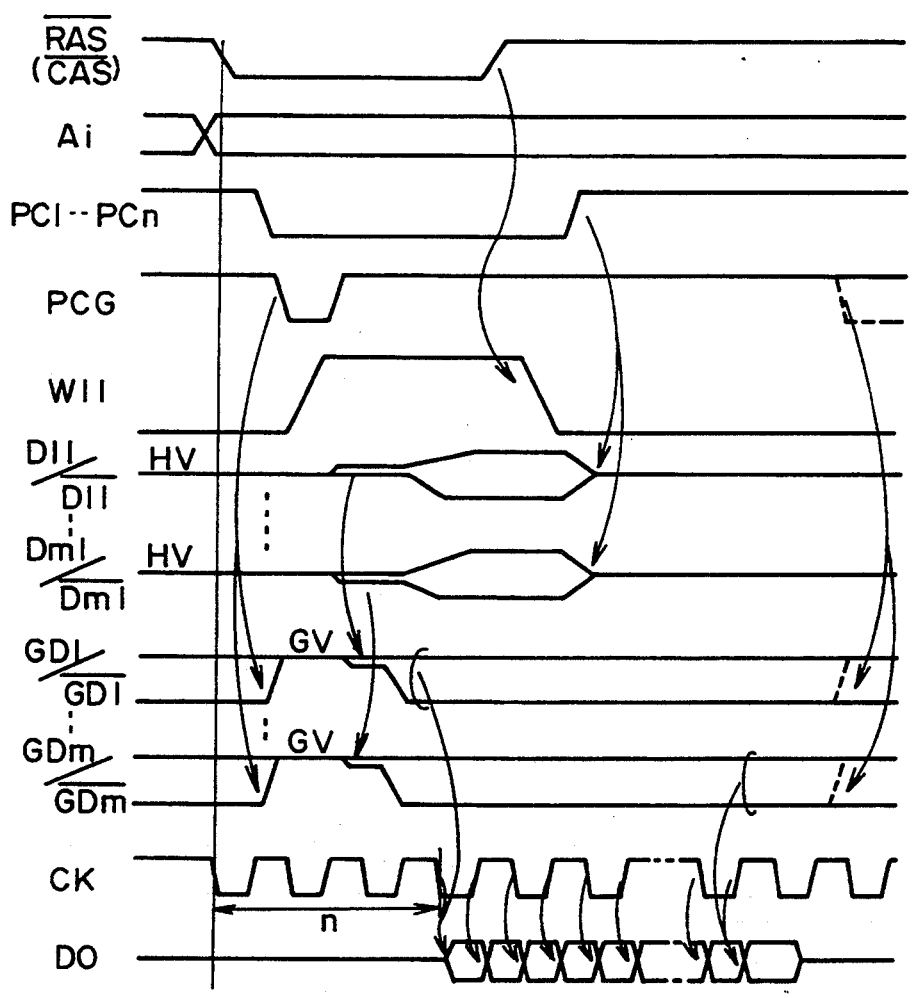
FIG. 2 is a timing chart of one example of the first reading operation of the first embodiment.
Figure 3:
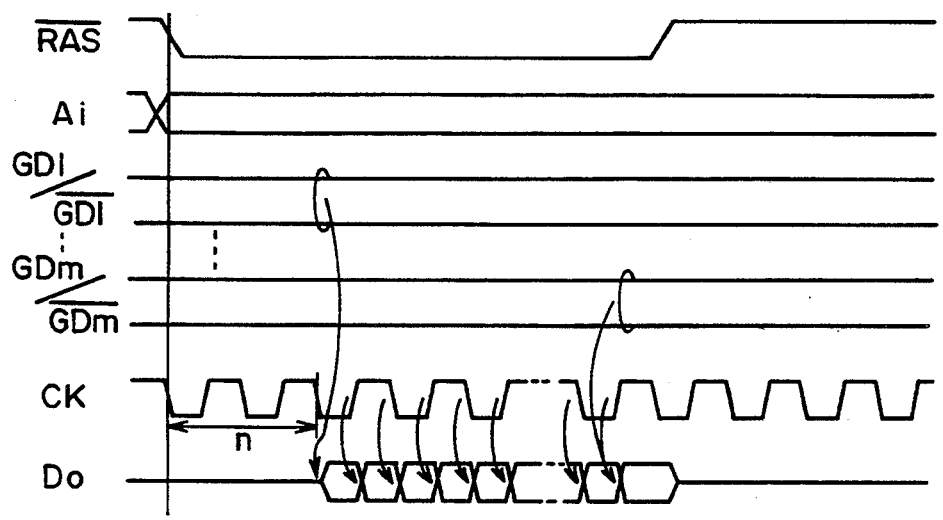
FIG. 3 is a timing chart of one example of the second reading operation of the first embodiment.
Figure 4:
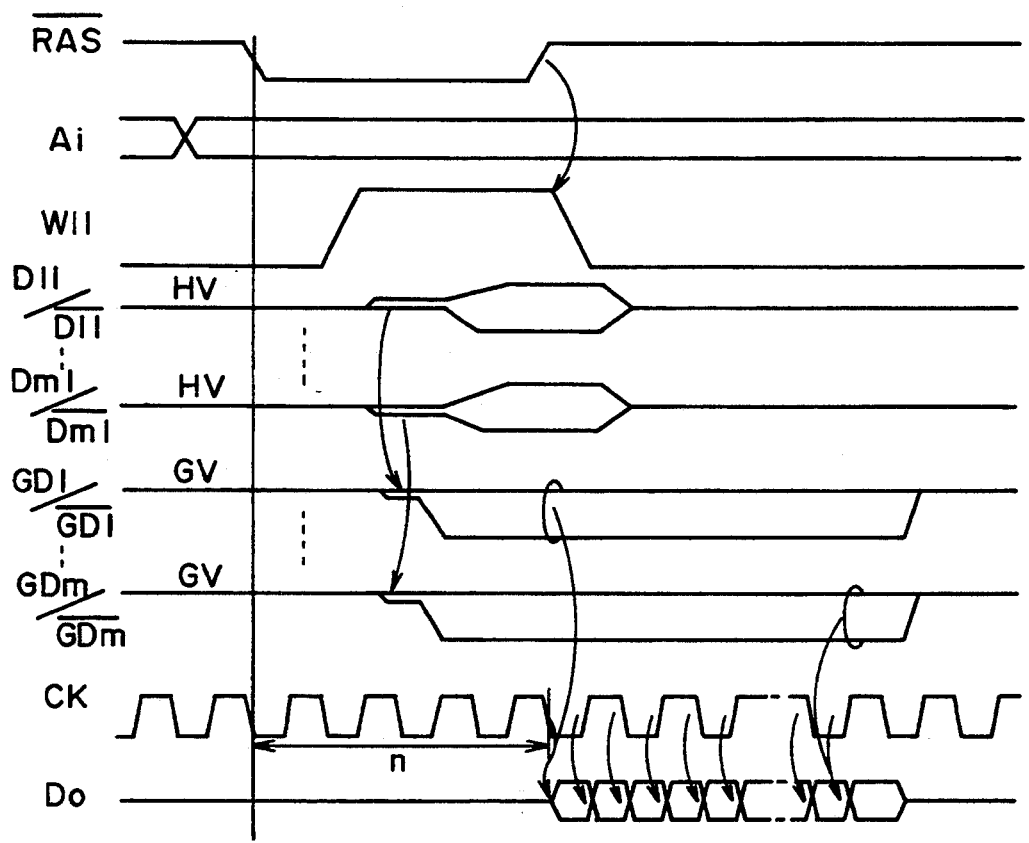
FIG. 4 is a timing chart of one example of the third reading operation of the first embodiment.

With reference to FIG. 2, a description will be made of one example of the operation for high speed reading at the mishitting time by use of the main amplifiers MA1 through MAm and global data lines GD1, /GD1 through GDm, /GDm. With reference to FIG. 3, a description will be made of one example of the consumption current reduction at the cache hitting time by use of the main amplifiers MA1 through MAm and global data lines GD1, /GD1 through GDm, /GDm. With reference to FIG. 4, a description will be made of one example of the operation for reading data in synchronism with the clock when they are not used as cache memories, and with reference to FIG. 5, a description will be made of the writing operation.

Referring to FIG. 2, there are shown signals /RAS, /CAS which determine that the address signal Ai for specifying memory cells are stored in the chip, and a clock signal CK for the system, which are not shown in FIG. 1. In this embodiment, there is a case in which the clock CK is not used but only the signals /RAS, /CAS are used to operate, or another case in which the signals /RAS, /CAS are not provided but only the chip selection signal and clock signal CK are used to control all the system. Here, the change of the signal /RAS from the high level to the low level means the selection of this chip. We considers that, n clocks after this level change, data is produced in synchronism with the clock CK. In the nonselection state in which the signal /RAS is the high level, all the word lines beginning with W11 are at the low level. The pairs of data lines D11, /D11 through Dmn, /Dmn are short-circuited and precharged at an intermediate potential HV by the high level of the signals PC1 through PCn at the end of the previous cycle. The signal read from the memory cells at the previous cycle is held on the pairs of global data lines GD1, /GD1 through GDm, /GDm by the main memories MA1 through MAm. The global data lines are short-circuited and made at the high level by the low level of the signal PCG contrary to the high level of the signal PC1 through PCn. In addition, the output D0 is held at a high impedance. When the signal /RAS is changed to the low level, the address signal is fed to within the chip and a word line is selected by the decoding operation. Here, it is assumed that the word line 11 is selected. At this time, it is also assumed that this address signal does not coincide with the address to a large number of memory cells of which the information is read on the pairs of global data lines GD1, /GD1 through GDm, /GDm at the previous cycle. The operation in the case of coincidence will be described with reference to FIG. 3. This comparator circuit may be provided on this chip or on another separate chip. According to this invention, unlike the prior art, the data lines are short-circuited at the low level and turned off by the signal PC1 through PCn, and the pairs of global data lines GD1, /GD1 through GDm, /GDm are short-circuited and precharged at a potential GV by the low level of the signal PCG in parallel with the operation of selecting the word line W11. When the pairs of global data lines GD1, /GD1 through GDm, /GDm are all held at the potential GV, the word line W11 becomes at the high level, and the signal from the memory cells appears on the pairs of data lines D11, /D11 through Dm1, Dm1. After the signal PCG is changed back to the high level, a signal corresponding to that on this data line pair is first caused to appear on the pairs of global data lines GD1, /GD1 through GDm, /GDm by the circuits within the means PA11 through PAm1. Here, the means PA11 through PAm1 are assumed not to amplify the signal on the pairs of data lines. The signal on the pairs of global data lines GD1, /GD1 through GDm, /GDm is amplified up to a large amplitude by the circuits within the main amplifiers MA1 through MAm, and fed to the following output circuit. The large-amplitude signal on the pairs of global data lines GD1, /GD1 through GDm, /GDm is fed back to the pairs of data lines D11, /D11 through Dm1, /Dm1 by the circuits within the means PA11 through PAm1 in order that it can be rewritten in the memory cells. At the end of the rewriting operation, the signal PC1 through PCn is changed to the high level, and causes the pairs of data lines D11, /D11 through Dm1, /Dm1 to be short-circuited and precharged at the potential HV. In addition, since the means for producing data in synchronism with the clock CK from the MPU is provided, the data on the pairs of global data lines GD1,/GD1 through GDm, /GDm is produced at the output D0 in synchronism with the clock CK beginning with the n-th clock with respect to the clock at which the signal /RAS has turned off. The number n is determined by the performance of the MPU and the performance of the DRAM using this invention. It is possible to provide means for setting the order of data being produced. Although both the leading edge and trailing edge of the clock CK are used for the synchronization as shown in FIG. 2, either one may be used for the synchronization though not shown in FIG. 2. As illustrated in FIG. 2, the signal /RAS is at the high level during the data production, so that the word lines are not selected and that the data lines are short-circuited. When a certain number of pieces of data are produced, the operation is automatically stopped. Also, there is a method in which, during the low-level period of the signal /RAS, the data output operation is synchronized with the clock CK, and when the signal /RAS becomes the high level, this operation is stopped, and the chip is made in the nonselection state. It is possible to take the operation that after the end of the operation, the signal PCG is left at the high level, while the pairs of global data lines GD1, /GD1 through GDm, /GDm hold or latch information since they are used as caches as indicated by the solid lines, and the operation that the signal PCG is changed to the low level so that the lines are again precharged as indicated by the broken lines. Either one of the operations can be realized by the chip design or the function for both operations can be provided by the design so that either one is specified by MPU or the like. The number n of the n-th clock CK at which data is started to produce, the precharged state or information-holding state of the pairs of global data lines GD1, /GD1 through GDm, /GDm and the number of pieces of data being produced can be specified by the necessary values which are stored in the registers on the chip upon power-on. Thus, it is not necessary that the chip be replaced by another one each time the performance of the MPU is changed. Also, there is another continuous reading system in which the address signal Ai or signal /CAS is selected to cause data on the lines GD1, /GD1 through GDm, /GDm to produce without use of new external clocks such as the so-called static column mode and the nibble mode.

FIG. 3 shows one example of the second reading operation of the first embodiment of FIG. 1. In this operation, the main amplifiers MA1 through MAm and pairs of global data lines GD1, /GD1 through GDm, /GDm are used as cache memories, and the caches are in the hit state. As illustrated in FIG. 3, information at the previous cycle is already held on the pairs of global data lines GD1, /GD1 through GDm, /GDm. Since the caches are in the hit state, the address signal Ai specified at a certain cycle as described above is included and held in the address of the memory cells of which the information is read on the main amplifiers MA1 through MAm and global data lines GD1, /GD1 through GDm, /GDm at the previous cycle since a large number of memory cells are connected to the word lines. At this time, information is held on the main amplifiers MA1 through MAm and global data lines GD1, /GD1 through GDm, /GDm, and thus produced at the output D0. At this time, the means provided for cache operation disables the functions for the word selection and the amplification on the data lines and global data lines. Therefore, there is no charging and discharging current, resulting in small consumption current. In addition, at the output appears only one bit or as shown in FIG. 3 continuous bits in synchronism with the clock CK. At the mishit time, the global data lines GD1, /GD1 through GDm, /GDm are precharged by the main amplifiers MA1 through MAm. This operation can be performed in parallel with the word line selecting operation as described with reference to FIG. 2, and thus the operation speed is high. Thus, the charging and discharging current is increased by the word line selecting operation and data line amplification operation. However, the hit rate can be increased by increasing the number of main amplifiers MA1 through MAm and global data lines GD1, /GD1 through GDm, /GDm, or the cache size or by optimizing the software to be executed by the system using this semiconductor device.

FIG. 4 shows one example of the reading operation simply in synchronism with the clock without using the pairs of global data lines as caches. When the signal /RAS is first at the high level, or in the nonselection state, all the word lines beginning with W11 are at the low level, and the pairs of data lines and the pairs of global data lines are respectively precharged at the potentials HV and GV by the signals PC1 through PCn and PCG, though not shown, similar to the case of FIG. 2. When the signal /RAS is changed to the low level, the address signal Ai is received and the corresponding word line W11 is selected. When the word line W11 becomes at the high level, a signal from the memory cells appears on the pairs of data lines D11, /D11 through Dm1, /Dm1. A signal corresponding to this data line pair signal first appears on the pairs of global data lines GD1, /GD1 through GDm, /GDm by the circuits within the means PA11 through PAm1. In this case, the means PA11 through PAm1 do not amplify the signal on the data line pair. The signal on the pairs of global data lines GD1, /GD1 through GDm, /GDm is amplified up to a large amplitude by the circuits within the main amplifiers MA1 through MAm, and fed to the following output circuit. The large-amplitude signal on the global data line pair GD1, /GD1 through GDm, /GDm is again fed back to the data line pair D11, /D11 through Dm1, /Dm1 by the circuits within the means PA11 through PAm1 in order to be again written in the memory cells. The operations mentioned so far are the same as the conventional operation of the hierarchical data lines. In this invention, a large number of pieces of data on the global data lines are produced in synchronism with the external clock CK. Thus, the number of times of charging and discharging the global data lines is decreased and hence the consumption current can be reduced. When the signal /RAS becomes the high level, this operation ends, and the chip is made in the nonselection state. After the end of the operation, the global data lines GD1, /GD1 through GDm, /GDm are again precharged by the signal PCG. Of course, after this, the operation for using the global data lines GD1, /GD1 through GDm, /GDm as caches may be performed.

Figure 5:
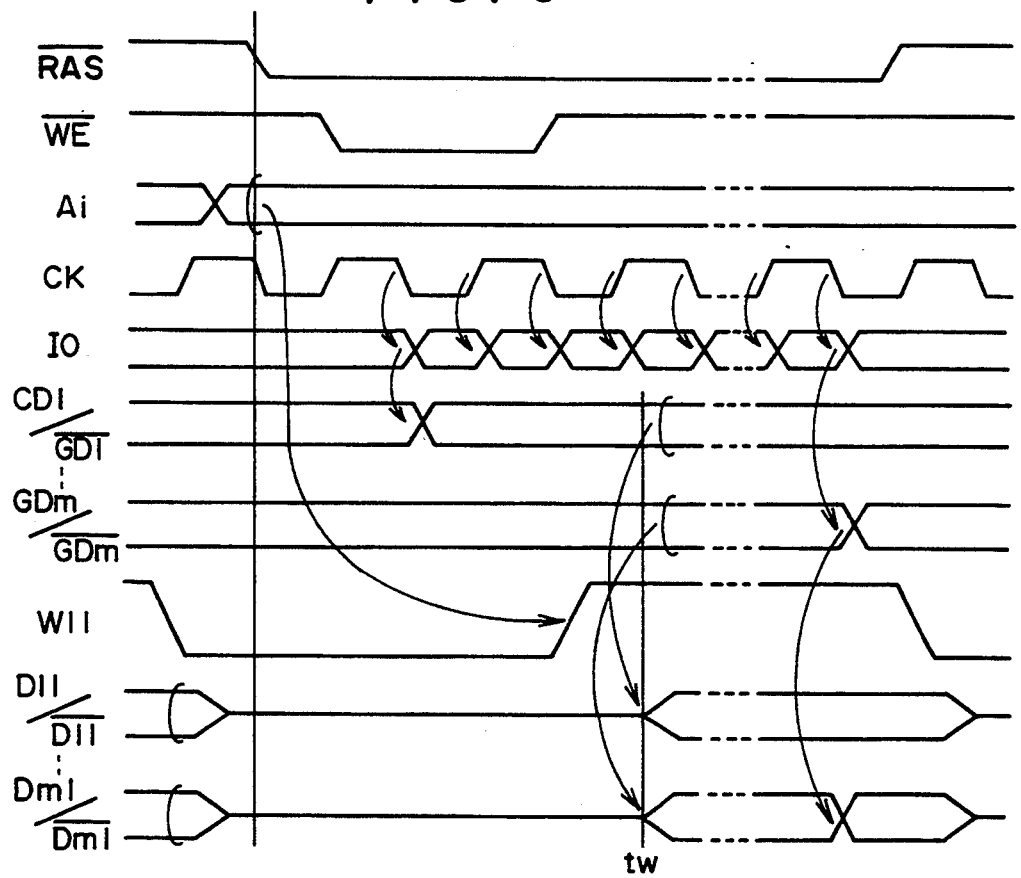
FIG. 5 is a timing chart of one example of the writing operation of the first embodiment.

FIG. 5 shows one example of the writing operation of the first embodiment of FIG. 1. The signal /WE not shown in FIG. 1 is the external input signal for selecting the writing operation or not. As illustrated in FIG. 5, the writing operation is brought about when the signal /WE is the low level. The other reference numerals same as in FIGS. 2 through 4 indicate like elements. When the signal /WE is the low level, and when the signal /RAS is the low level, the writing operation is started. Just before this operation, the information at the previous cycle is stored on the global data lines, and the data lines are held in the precharged state. In the operation shown in FIG. 5, data is first written at a high speed on the global data lines in synchronism with the external clock CK. Independently of this, the word lines are selected by decoding operation. Then, at time tw, the switch for connecting the global data lines and data lines is turned on, permitting information within the global data lines to be transferred to the data lines. At this time, the information so far written on the global data lines until time tw can be written on the data lines at a time. This writing operation may be made after all information has been written on the global data lines. The word line selecting operation is not necessary to be waited for the start of the writing operation. Also, the writing operation on the cells can be performed by transferring the data already written on the global data lines to the data lines. Therefore, the writing time is short irrespective of the hit or mishit time.

Figure 6:
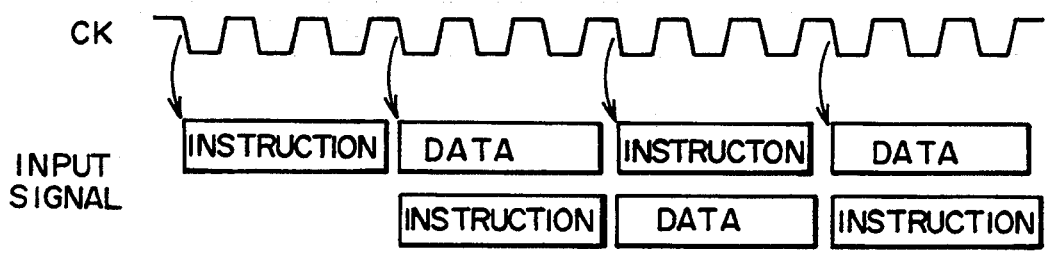
FIG. 6 is a timing chart of the external bus input signal of DRAM using the first embodiment.

FIG. 6 is a timing chart of the external input signal fed through a bus system to the DRAM to which the first embodiment of the invention is applied. A set of an instruction for operation mode and an external signal for specifying an address is first supplied, and then a set of data signal is fed, in synchronism with the external clock CK. As described above, for example, upon writing, the data signal may be simply written on the global data lines in synchronism with the external clock CK. If registers for only this operation are provided, the circuit for receiving the instruction can make the next operation. Thus, if the pin number is not limited, the next instruction can be received while data is being inputted.

Figure 7:
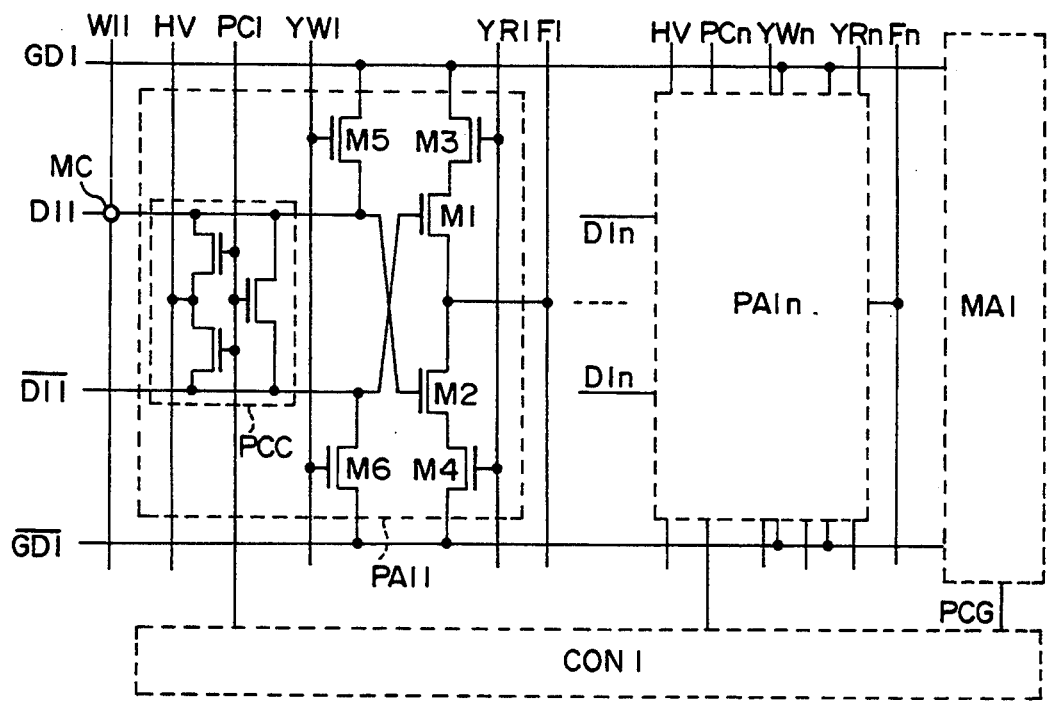
FIG. 7 is a diagram of a first example of the preamplifier used in the first embodiment.

FIG. 7 shows a first specific example, PA1 through PA1n of the preamplifiers represented by PA11 through PAmn in FIG. 1. In this example, the signal on the pairs of data lines is not amplified. In FIG. 7, D11, D11 through D1n, /D1n represent the pairs of data lines, which are connected through preamplifiers PA11 through PA1n to the global data lines GD1, /GD1. In the preamplifiers PA11 through PA1n, as indicated at PA11, the data line pair D11, /D11 are connected to the gates of nMOSTs M1 and M2 having the common source F1. This source F1 is held at a low potential necessary for the nMOSTs M1 and M2 to be operated as a differential amplifier. M3 and M4 represent switches for connecting the drains of the nMOSTs M1 and M2 to the global data lines upon reading. These switches are controlled by YR1. Also, M5 and M6 indicate switches for directly connecting the pairs of data lines to the pairs of global data lines upon writing and rewriting, and these switches are controlled by YW1. The nMOST within the PCC is a circuit for short-circuiting the pairs of data lines and precharging them at a potential HV independently of the global data lines. This circuit is controlled by PC1. The preamplifiers PA11 through PA1n have the same circuit arrangement, and the signals F1 through Fn, YR1 through YRn, YW1 through YWn, PC1 through PCn are different in the address being selected, but of the same kind. The circuit CON1 controls the signals PC1 through PCn and PCG, and is able to short the pairs of data lines and the pairs of global data lines independently of each other. Thus, it is possible to increase the operation speed at the mishit time at which the global data lines and main amplifiers are used as cache memories. Ones of the word lines and the memory cells are respectively represented by W11 and MC on the data lines D11, /D11. Since the preamplifiers are formed only by nMOSTs, and since no pMOST is used, the number of elements can be decreased as compared with the prior art in which a CMOS sense amplifier for each pair of data lines and hierarchical data lines are provided. In addition, since no element isolating regions are not necessary, the area in which elements are formed can be decreased.

Figure 8:
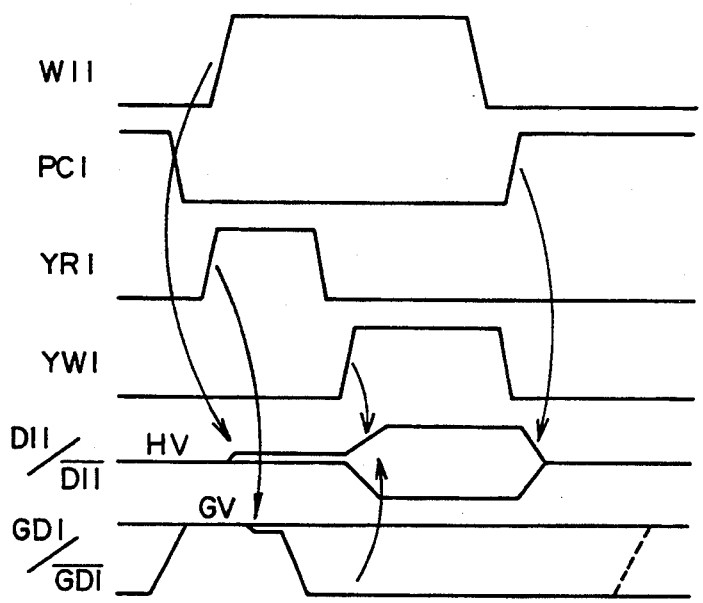
FIG. 8 is a timing chart of one example of the operation of the circuit arrangement of FIG. 7.

One example of the operation of the circuit arrangement of FIG. 7 will be described with reference to FIG. 8. In FIG. 8, although the signals /RAS, Ai, CK shown in FIGS. 2 through 6 are not shown, the W11, PC1, YW1, YR1 specified by the address Ai are selected by the same operation. First, in standby mode, all the word lines beginning with W11 are held at the low level, the signals PC1 through PCn are the high level, and the data lines D11, /D11 through D1n, /D1n are held at the potential HV. The global data lines GD1, /GD1 hold information obtained at the previous cycle. Upon operation, the signal PC1 is selected and becomes the low level, and the data lines D11, /D11 are brought into the floating state. When the word line W11 is changed from the low level to the high level, the signal from the memory cells is read on the data lines, so that a very small signal appears on the data lines D11, /D11. At the same time, as described with reference to FIG. 2, the global data lines GD1, /GD1 though not shown in FIG. 8 are short-circuited by the signal PCG, and precharged at the potential GV. When the signal YR1 is changed to the high level, the switches M3 and M4 are turned on. Thus, the current corresponding to the very small signal difference on the data lines D11, /D11 connected to the gates of the nMOSTs M1 and M2 flows from the global data lines GD1, /GD1 through the switches M3 and M4 to the common source F1. Therefore, a very small voltage difference not shown is produced on the global data lines GD1,/GD1. This very small signal is amplified up to the amplitude necessary for rewriting by the circuit of the main amplifier MA1 not shown. Then, the signal YR1 is changed to the low level and the switches M3 and M4 are turned off. The signal YW1 is changed to the high level and the switches M5 and M6 are turned on so that the amplitude necessary for rewriting which appears on the global data lines GD1, /GD1 is transmitted to the data lines D11, /D11. Thus, since the rewriting operation is completed, the word line 11 will be changed back to the low level. Thereafter, the signal PC1 is changed to the high level, and the data lines D11, /D11 are short-circuited and precharged at the potential HV for the next cycle. The global data lines GD1, /GD1 can be left to hold information or can be precharged at the potential GV.

Figure 9:
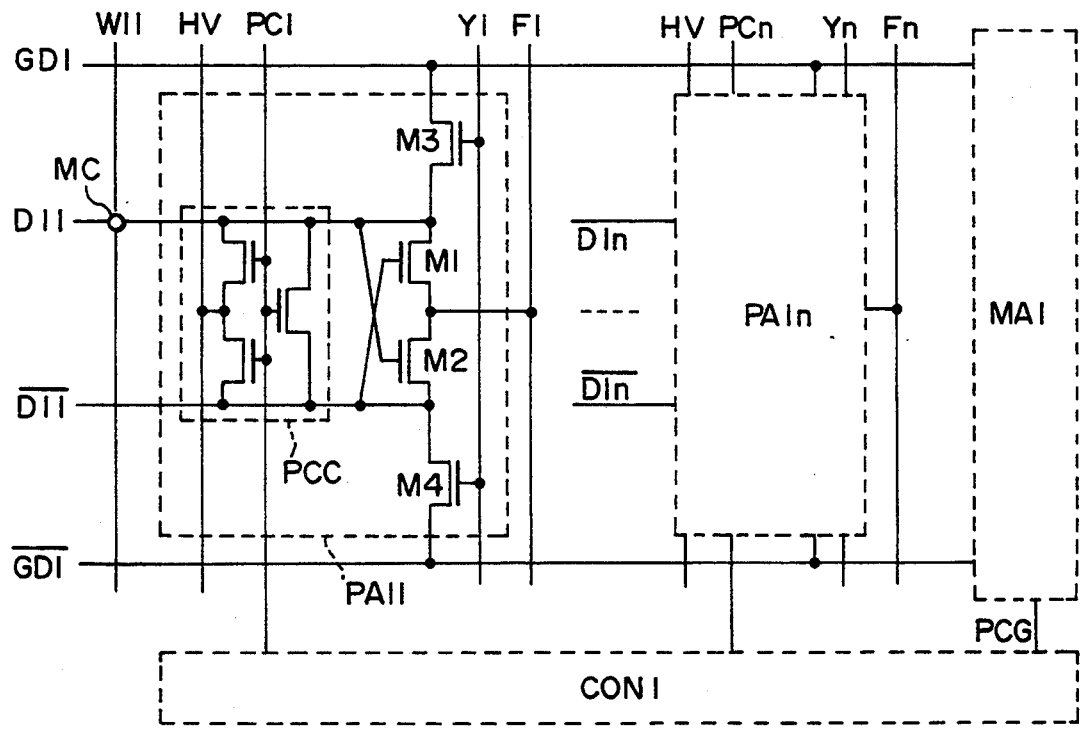
FIG. 9 is a diagram of a second example of the preamplifier used in the first embodiment.

FIG. 9 shows a second specific example, PA11 through PA1n of the preamplifiers PA11 through PAmn shown in FIG. 1. The circuit arrangement of FIG. 9 is different from that of FIG. 7 in the connection between the data lines D11, /D11 and the nMOSTs M1 and M2. In other words, the data line D11 is connected to the drain of the nMOST M1 and to the gate of the nMOST M2, and the data line /D11 is connected to the drain of the nMOST M2 and to the gate of the nMOST M1. F1 represents the signal for driving the nMOSTs M1 and M2. Thus, unlike the circuit arrangement of FIG. 7, the signal read on the data lines can be amplified to some extent. In addition, the global data line GD1, /GD1 is connected to data line D1, /D11 by the switches M3, M4 which are controlled by signal Y1. The other preamplifiers are operated in the same way, and the other like elements corresponding to those in FIG. 7 are identified by the same reference numerals. Thus, since the preamplifier is formed of only nMOSTs, this structure is superior to the conventional system in which the CMOS sense amplifier is provided for each pair of data lines without use of the hierarchical data lines. That is, the number of elements used is small since no pMOSTs are used, and the area to be occupied is small since no element isolating regions are required. In addition, since the read signal is amplified on the data line by the preamplifier, the load of the global data line may be large, and the load on the main amplifier is small.

Figure 10:
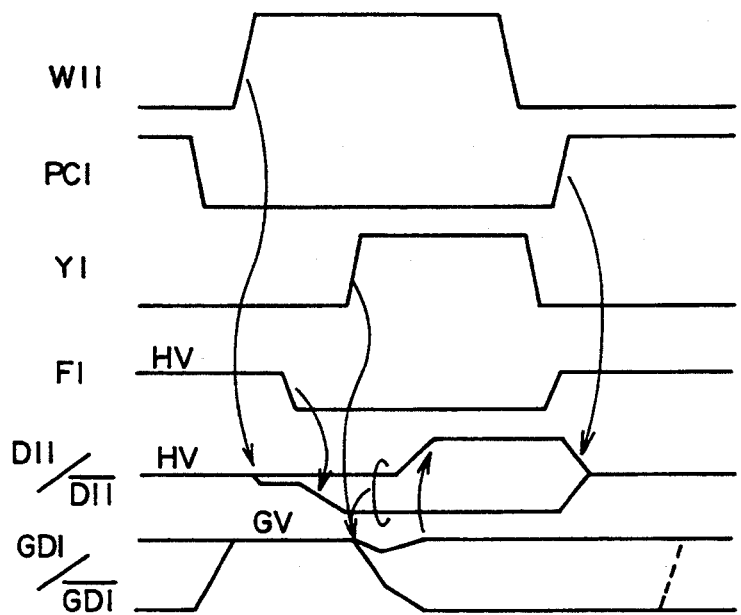
FIG. 10 is a timing chart of one example of the operation of the circuit arrangement of FIG. 9.

One example of the operation of the circuit arrangement shown in FIG. 9 will be described with reference to FIG. 10. The signals /RAS, Ai and CK are omitted in FIG. 10. First, in standby mode, the word lines beginning with W11 are all at the low level, the signals PC1 through PCn are the high level, and the data lines D11, /D11 through D1n, /D1n are kept at the potential HV. The signal F1 is also kept at the potential HV. The short circuit is turned off by the signal PCG, and the global data lines GD1, /GD1 have the previous-cycle information kept by the amplifier. Upon operation, the signal PC1 becomes the low level, and the data lines D11, /D11 are brought into the floating state. When the word line W11 is changed from the low level to the high level, the signal from the memory cells is read on the data lines so that a very small signal appears on the data lines D11, /D11. At the same time, as described with reference to FIG. 2, the global data lines GD1, /GD1 are short-circuited and precharged at the potential GV by the signal PCG. Then, the signal source F1 is changed from the potential HV to the low level. Thus, the very small signal on the data lines D11, /D11 is amplified only for the low level side as illustrated. Then, the switches M3 and M4 are turned on by the high level of the signal Y1. Thus, a signal corresponding to the signal on the data line D11, /D11 appears on the global data line GD1, /GD1. This signal is amplified to the amplitude necessary to rewrite by the circuits, not shown, of the main amplifier MA1. This amplitude is transmitted through the switches M3, M4 to the data lines D11, /D11, and again written. Then, the word line W11 is changed back to the low level. In addition, when the signal PC1 is changed to the high level, the data lines D11, /D11 are short-circuited and precharged at the potential HV for the next cycle. The global data lines GD1, /GD1 have information kept or they are precharged at the potential GV.

Figure 11:
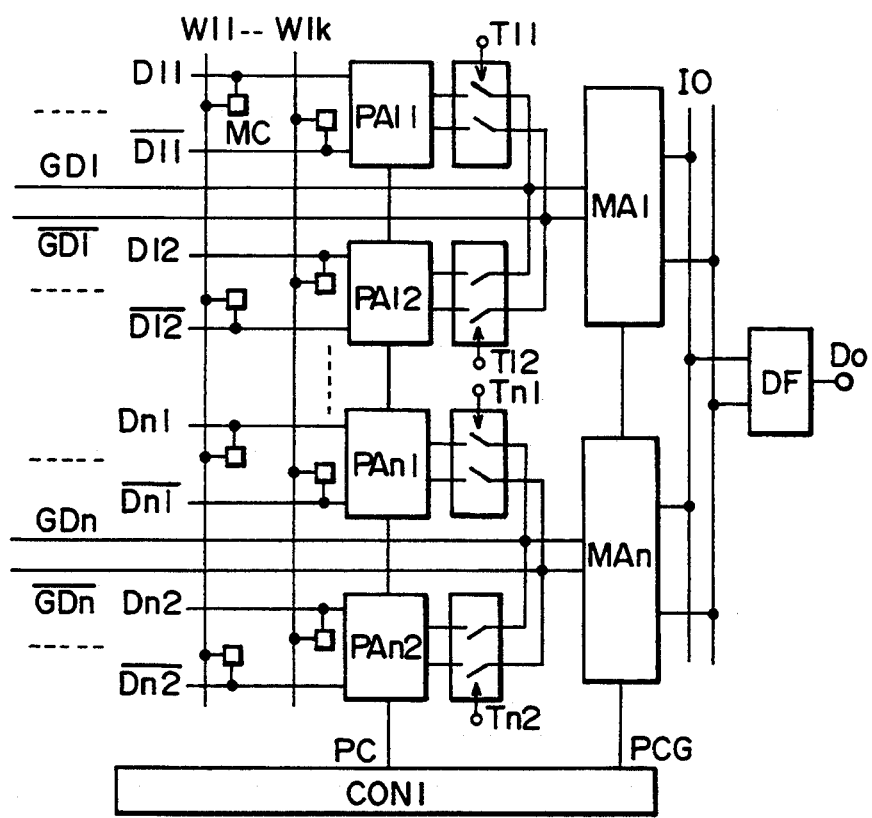
FIG. 11 is a diagram of a second embodiment of the invention.
Figure 13:
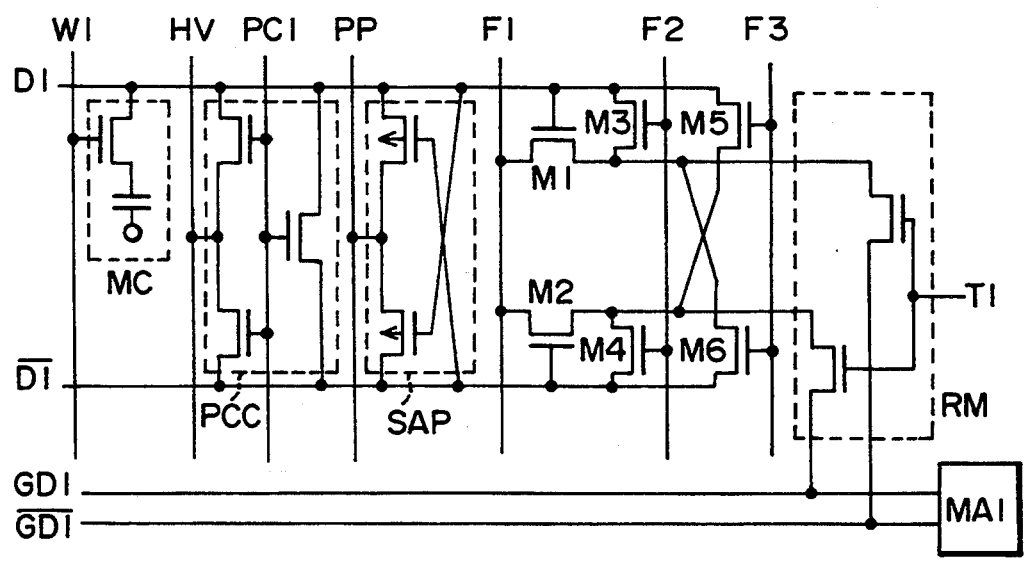
FIG. 13 is a diagram of an example of the preamplifier used in the second and third embodiments.

FIG. 11 shows the second embodiment of the invention. In the first embodiment of FIG. 1 the wiring pitch of data line pairs on the layout is equal to that of global data line pairs, while in the second embodiment of FIG. 11 the pitch of one global data line pair corresponds to two data line pairs. In other word, the parallel data line pairs D11, /D11 and D12, /D12 correspond to global data line pair GD1, /GD1, and the data line pairs Dn1, /Dn1 and Dn2, /Dn2 correspond to global data line pair GDn, /GDn. The switches T11 through Tn2 select one pair of two data line pairs and connects it to the global data line pair. In FIG. 11, the other like elements corresponding to those in FIG. 1 are identified by the same reference numerals. Preamplifiers PA11 through PAn2 having a threshold voltage scattering compensation circuit are provided for data line pairs, respectively. There are two cases in which the preamplifiers each have or do not have an amplifier for rewriting as in the embodiment of FIG. 1. If no rewriting amplifier is provided, a rewriting circuit is provided on the main amplifier side so that data are rewritten on two pairs of data lines in time sequence. If a rewriting amplifier is provided, a rewriting circuit is provided for each preamplifier. In this case, too, the direct sense system can be employed as shown in FIG. 13. In the second embodiment, since the number of main amplifiers MA1 through MAn and global data lines is halved, the size of the cache is reduced to a half, thus decreasing the hit rate the more. However, the wiring pitch of the global data lines is reduced and thus it is easy to form the wiring conductors. In addition, the charging and discharging currents to or from the global data lines are decreased, and the global data lines are not always necessary to be kept at a large amplitude which is necessary for rewriting. While a global data line pair is provided for each two pairs of data lines as illustrated, a global data line pair may be provided for, for example, each four data line pairs.

Figure 12:
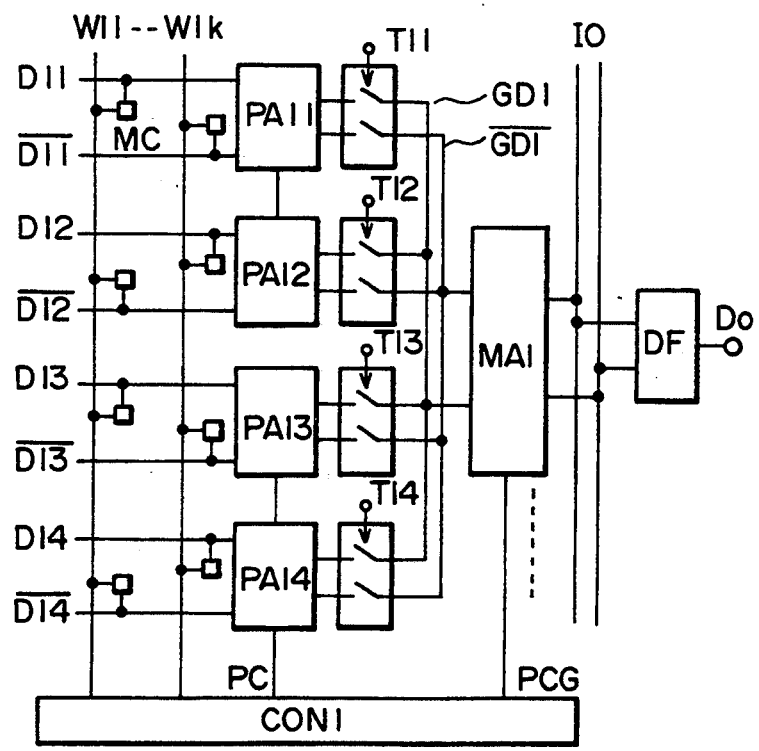
FIG. 12 is a diagram of a third embodiment of the invention.

FIG. 12 shows the third embodiment of the invention. In this embodiment, the global data lines are perpendicular to the data lines. In FIG. 12, the like elements and functions are identified by the same reference numerals as those in FIG. 11, and the global data line pair GD1, /GD1 is connected through the switch T11 through T14 to each of the four data line pairs D11, /D11 through D14, D/D14. The preamplifiers connected to the data line pairs sometimes include rewriting circuits. The main amplifier MA1 is used as a cache.

Figure 14:
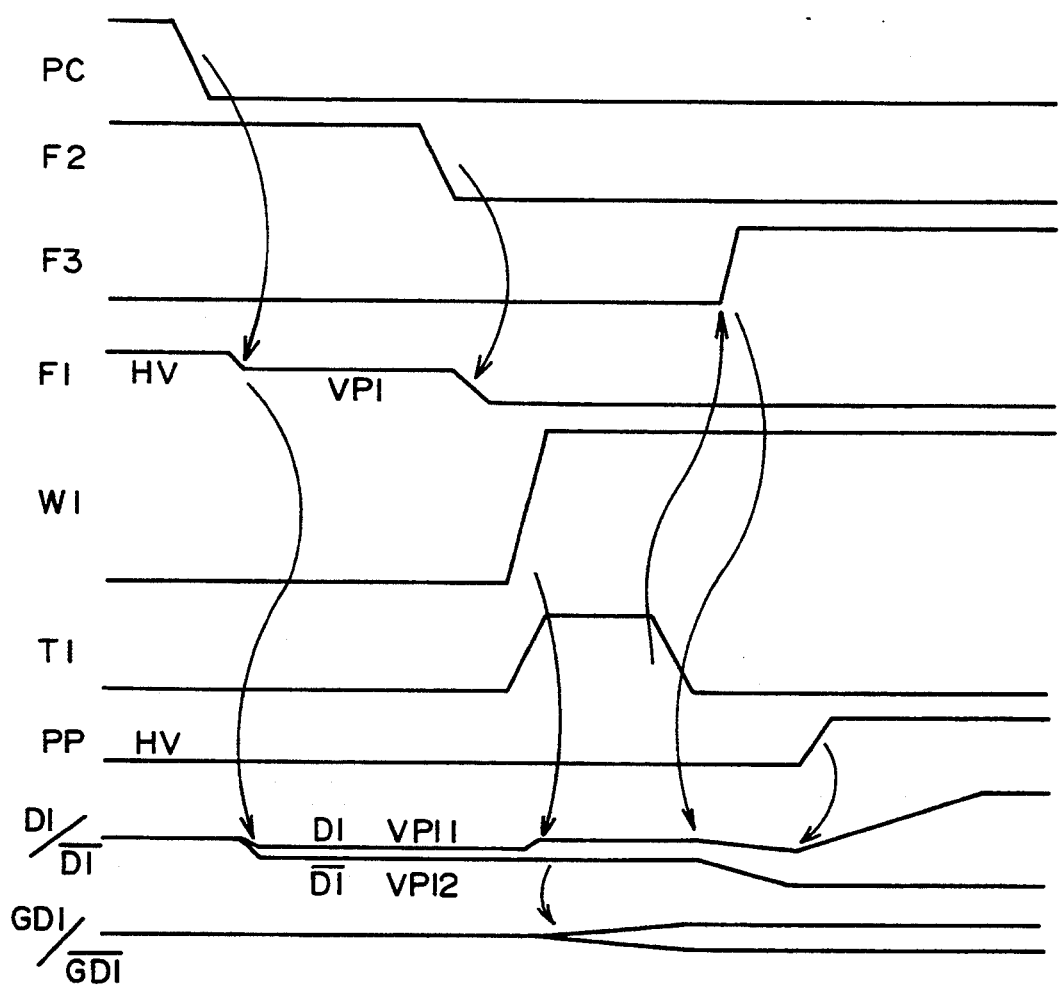
FIG. 14 is a timing chart of one example of the operation of the circuit arrangement of FIG. 13.

FIG. 13 shows one example of the preamplifier used in the second and third embodiments. This preamplifier serves both as a rewriting circuit and as a threshold voltage scattering compensation circuit. Shown at MC is a memory cell in which when the word line W1 is selected, the information thereon is produced on terminal D1. D1, /D1 is the input/output terminal of the amplifier circuit which is formed of MOS M1 through M6. PCC is the circuit for short-circuiting the input-/output terminal and precharging it to the same potential HVD, PC is the control signal to the circuit, and HVD is the power supply for precharging. SAP is the amplifier circuit which has the input/output terminals D1, /D1, and PP is the control signal to this amplifier. RM is the MOS switch for electrically connecting the terminals D1, /D1 to the global data lines GD1, /GD1, and T1 is the control signal to this switch. The operation of this embodiment will be described with reference to FIG. 14. At first, the control signal PC is the high level VC, and the input/output terminal D1, /D1 is precharged at the voltage HV. The signal F1 is the high level VC, and MOS switches M3, M4 are conductive. The signal F2 is the low level, and switches M5, M6 are in the off state. The signal F1 is at the level HV. The word line W1 and terminal T1 are at the low level, and PP is at the voltage HV. First, the signal PC is changed from the high level to the low level, and the input/output D1, /D1 becomes in the floating state. Then, the signal F1 is changed from the potential HV to the level VP1. At this time, since the MOS switches M3, M4 are conductive, the voltage at the input/output terminal D1, /D1 is reduced to the voltage VP11, VP12 according to the threshold voltage of the MOS switches M1, M2. If the threshold voltage of switch M2 is smaller than that of switch M1, the voltage VP12 at the terminal /D1 is lower than the voltage VP11 of the terminal D1. Thus, the state in which current is easy to flow due to the low threshold voltage is cancelled out if the voltage at the terminal /D1 which serves as the gate voltage to this MOS is reduced to be less than that at the terminal D1. An equal current is caused to flow in the switches M1, M2 by the levels of VP11, VP12. Thereafter, the terminals F1 and F3 are changed to the low level. When the word line W1 is changed from the low level to the high level, the memory cell MC generates a signal at the terminal D1, and the original differential voltage signal is produced on terminals D1, /D1. At this time, the terminal T1 is changed from the low level to the high level, and a current difference according to the differential voltage signal appears on the global data line pair GD1, /GD1. This current difference results from cancelling the current difference due to the threshold voltage scattering of the switches M1, M2. The operation for changing this terminal T1 to the high level can be performed in substantially the same timing as the word line selection operation, or the so-called direct sense operation is carried out. Then, when the current difference at RO, /RO is changed to a voltage difference and supplied to and latched by the following main amplifier MA1, the terminal T1 is changed from the high level to the low level so that the MOS within the RM is turned off. Then, the rewriting operation is started, the terminal F2 is changed to the high level VC, and the switches M5, M6 are turned on so that the same arrangement as the normal sense amplifier is brought about in the M1, M2 of which the gages are crosswise connected to the gates. Thus, the voltage difference at the terminals D1, /D1 is amplified. At this time, the voltage difference appearing on the lines D1, /D1 is the result of cancelling out the scattering of the threshold voltage of the M1, M2, and thus it is amplified at a high speed. When a certain large signal voltage is generated, the line PP is changed from the level HV to the high level for writing, and the signal on the line D1, /D1 is amplified to the maximum amplitude. Although the MOS within the SAP also has scattered threshold voltages, the scattering has almost no effect since a large signal voltage is already generated. Thus, by using the preamplifier shown in FIG. 13, it is possible to simultaneously make the threshold voltage compensation, direct sense operation and rewriting operation.

Figure 15:
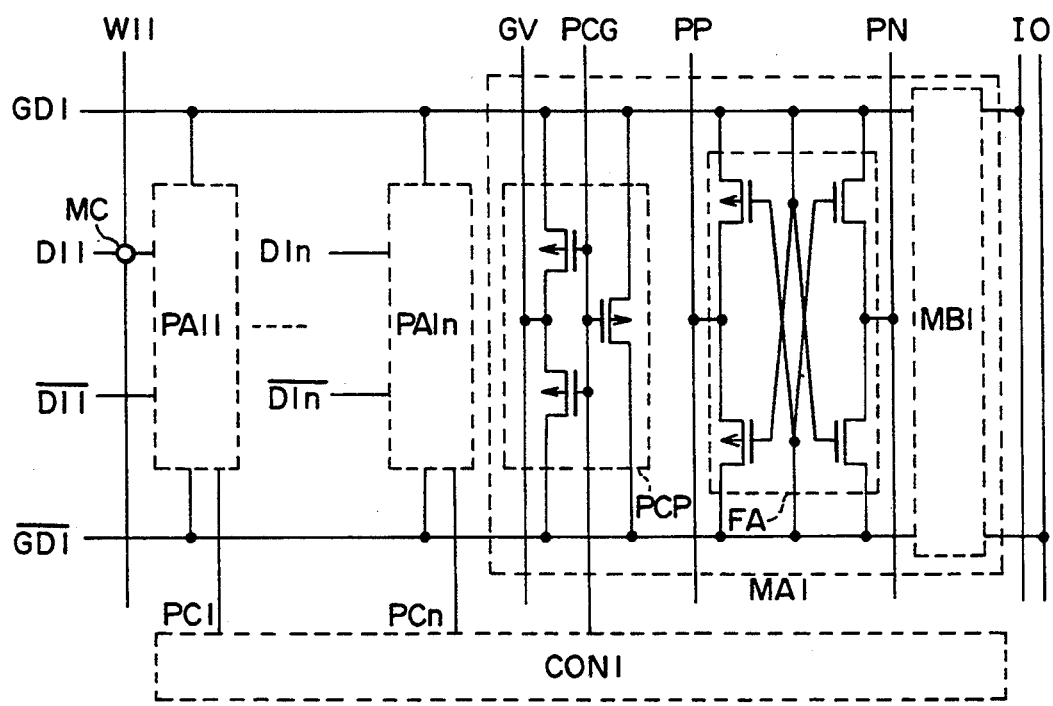
FIG. 15 is a diagram of an example of the main amplifier used in this invention.
Figure 17:
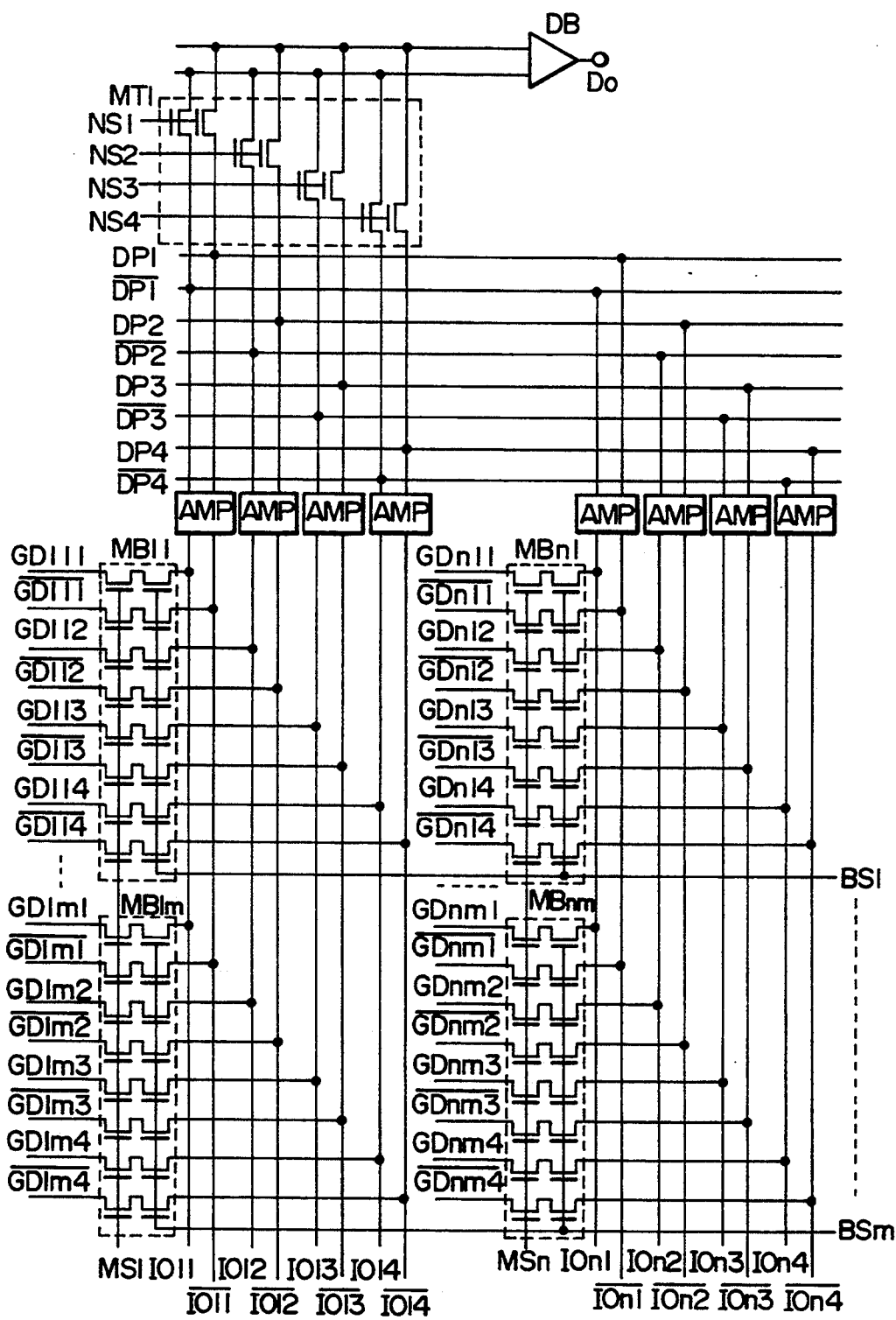
FIG. 17 is a diagram of one example of the reading system.

FIG. 15 shows a specific example of the main amplifier MA1 of the main amplifiers MA1 through MAm shown in FIG. 1. The main amplifier MA1 is formed of circuit blocks PCP, FA and MB1. The circuit block PCP is formed of pMOSTs, and used to short the global data lines GD1, /GD1 and precharge them at the potential GV. A drive signal PCG is supplied to this circuit block. The circuit block FA is a sense amplifier which is formed of CMOS flip-flops. This sense amplifier is driven by drive signals PN and PP to amplify the signal on the global data line pair GD1, /GD1 to the amplitude necessary to rewrite. The block MB1 is used to connect the global data line pair GD1, /GD1 to the IO lines. A specific example of this circuit block is shown in FIG. 17. In FIG. 15, the other like elements corresponding to those in FIG. 7 are identified by the same reference numerals. Since this main amplifier MA1 is constructed as mentioned above, the global data lines GD1, /GD1 are short-circuited and precharged to the potential GV independently of the operation on the data lines. Therefore, the high speed operation shown in FIG. 2 can be achieved. In addition, the signal fed from data lines to the global data lines GD1, /GD1 can be amplified to the amplitude necessary to rewrite, and fed to the IO lines which are connected to the following output circuit. Thus, the preamplifiers PA11 through PA1n can be formed of only nMOSTs shown in the specific examples of FIGS. 7 and 9 and thus can be built up on a small area.

Figure 16:
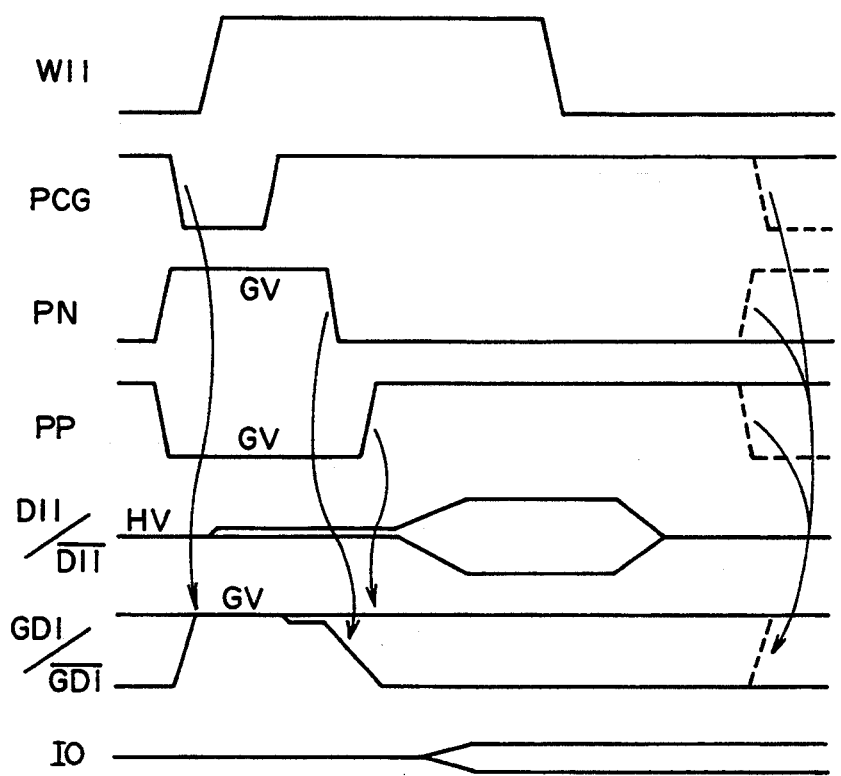
FIG. 16 is a timing chart of one example of the operation of the circuit arrangement of FIG. 15.

One example of the operation of the circuit arrangement of FIG. 15 will be described with reference to FIG. 16. The signals /RAS, CK and Ai are omitted in FIG. 16. In standby mode, the word lines beginning with W11 are all at the low level, and the data lines D11, /D11 through D1n, /D1n are precharged at the potential HV by, for example, the circuits shown in the specific example of FIG. 7. Since the drive signal PCG is at the high level, the pMOSTs within the block PCP are turned off. Also, since the drive signals PN and PP are the low level and the high level, respectively, the information at the previous cycle is kept on the global data lines GD1, /GD1. The IO lines are precharged at a necessary potential by the circuit, now shown, within the block MB1 or by the following circuit now shown. Upon operation, the word line W11 is selected, while the drive signal PCG is changed to the low level, and the drive signals PN and PP are changed to the low potential GV, so that the global data lines GD1, /GD1 are short-circuited and precharged at the potential GV. At the same time, the word line W11 is changed to the high level so that the very small signal is read from the memory cells to the data lines D11, /D11. Thereafter, the signal PCG is changed to the high level and the global data lines GD1, /GD1 are in the floating mode. Then, the preamplifier of which the circuit arrangement and operation have been mentioned with reference to FIGS. 7 and 8 causes the signal corresponding to the very small signal on the data lines D11, /D11 to appear on the global data lines GD1, /GD1 as illustrated. Thereafter, this signal is amplified when the drive signal PN is changed to the low level. When the drive signal PP is changed to the high level, the global data lines GD1, /GD1 are kept at the high level after the amplification. This amplification makes it possible that a signal of the amplitude necessary to rewrite is produced on the global data lines GD1, /GD1. This signal is fed back to the data lines D11, /D11 by the preamplifier PA11, and when the rewriting is completed, the word line is changed to the low level. At the same time, the circuits within the block MB1 causes the signal corresponding to the signal on the global data lines GD1, /GD1 to appear on the IO lines, and to supply it to the following output circuit.

FIG. 17 shows a specific circuit arrangement for realizing the continuous reading operation synchronized with the clock CK according to this invention mentioned with reference to FIGS. 2 through 4. In this circuit arrangement, four bits are read at a time in parallel from the global data lines and converted into a serial form by the output circuit. There are shown series circuits MB11 through MBnm of two nMOSTs each which connect the global data lines GD111, /GD111 through GDnm4, /GDnm4 to IO line pairs IO11 through IOn4. The gates of one-side nMOSTs of the series circuits are connected to lines MS1 through MSn, and the gates of the other-side nMOSTs are connected to lines BS1 through BSm. Only when both lines MS1 through MSn and BS1 through BSm are at the high level, the data on the global data lines is transmitted to the IO line pairs. The series circuits MB11 through MBnm may be formed of NAND circuits. The IO line pairs is formed of n sets of four IO line pairs opposite to the lines MS1 through MSn. Each IO pair is connected to an amplifier/transfer circuit AMP. The IO pairs are connected through the AMPs to the four pairs of signals DP1, /DP1 through DP4, /DP4. As shown in FIG. 17, the IO line pairs IO11 through /IOn4 are connected to the signals DP1, /DP1 through DP4, /DP4, so that the last numbers of the reference numerals coincide with each other. In addition, the signals DP1, /DP1 through DP4, /DP4 are converted by the circuit MT1 and signals NS1 through NS4 into a serial form and fed through an output buffer DB to the output end D0. At this time, since the signals NS1 through NS4 are switched in synchronism with the clock CK to the system, the output signal at the output end D0 can be synchronized with the clock CK.

Figure 18:
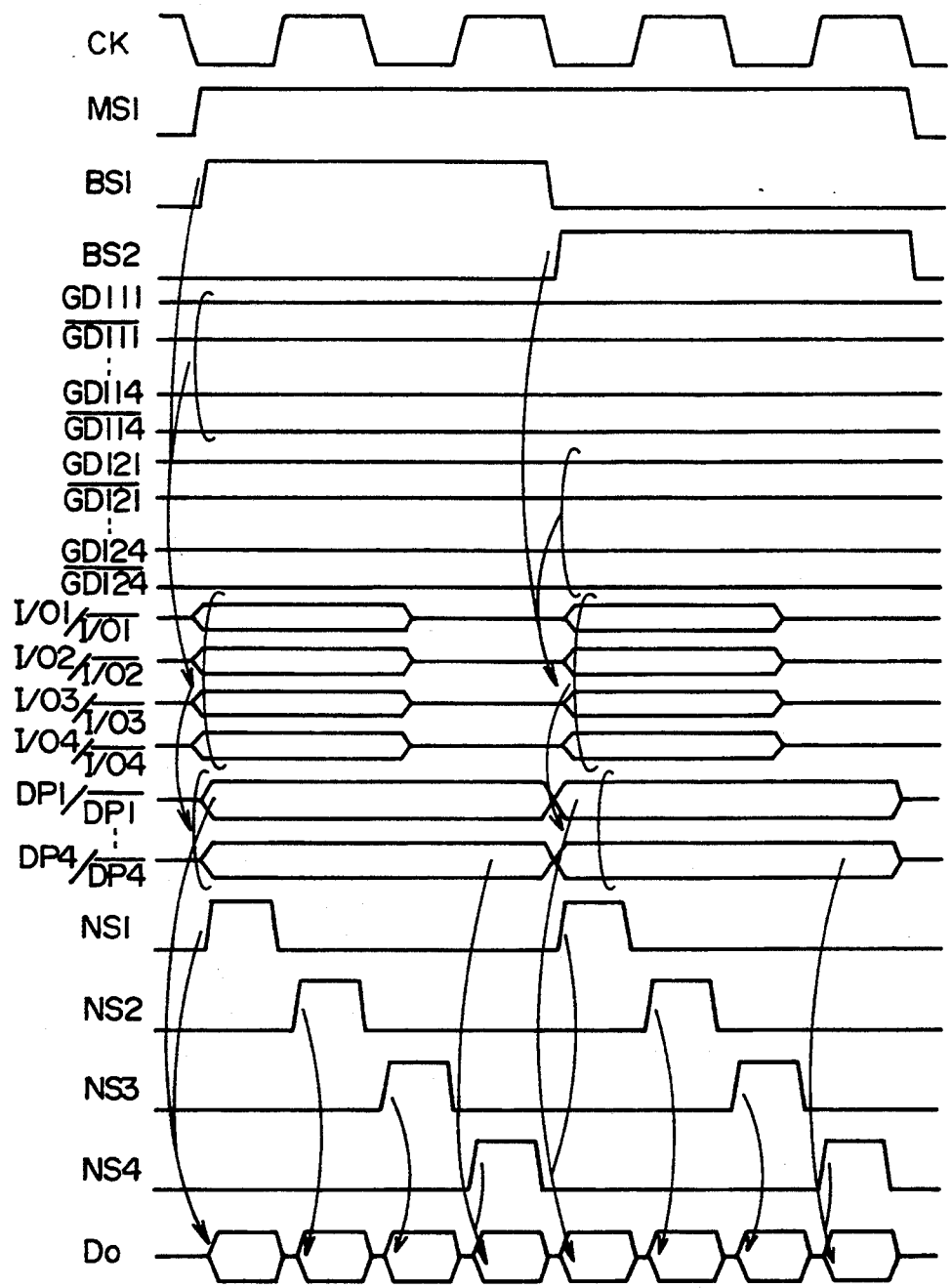
FIG. 18 is a timing chart of one example of the operation of the circuit arrangement of FIG. 17.

One example of the operation of the circuit arrangement will be described with reference to FIG. 18. This figure shows that the line MS1 is selected and that the lines BS1 and BS2 are alternately selected. The selection of word lines, reading the memory cells and the amplification on the data lines and global data lines are performed at the end of the operation. First, the lines MS1 and BS1 are selected, and the nMOSTs within the block MB11 are turned on. Thus, data on the global data lines GD111, /GD111 through GD114, /GD114 are transferred to the IO lines IO1, /IO1 through IO4, /IO4. While in this embodiment four bits are processed in parallel, eight or more bits may be processed in parallel. The data on the IO lines IO1, /IO1 through IO4, /IO4 are amplified by the AMPs and appear on the lines DP1, /DP1 through DP4, /DP4, or four bits are produced in parallel. As to the data on the DP1, /DP1 through DP4, /DP4, when the signal NS1 becomes the high level, the data on the line DP1, /DP1 is produced at the output end D0. When the signals NS2, NS3, NS4 are turned on in order, data on lines DP2, /DP2 through DP4, /DP4 are produced at the output end D0. The signals NS1 through NS4 are switched in synchronism with the clock CK. The order of data appearing at the output terminal D0 can be changed, or for example, data may be produced in the order of DP1, /DP1, DP3, /DP3, DP2, /DP2, DP4, /DP4. When four-bit data is produced at the output end D0, the line BS1 is changed back to the low level, and then the line BS2 is changed to the high level. Thus, data on the global data lines GD121, /GD121 through GD124, /GD124 are transferred in parallel to the IO lines IO1, /IO1 through IO4, /IO4. The data on the IO lines IO1, /IO1 through IO4, /IO4 are amplified by the AMPs and appear on the lines DP1, /DP1 through DP4, /DP4 according to the same operation as previously mentioned. The data are produced in order at the output end D0 when the signals NS1, NS2, NS3, NS4 are sequentially changed to the high level. Then, the line MS1 is changed to the low level as shown in FIG. 18. This operation can be performed for all combinations of BS1 through BSm and MS1 through MSn. Thus, 4×m×n bits of data can be continuously transferred at a high speed. These operations are synchronized with the clock CK to the system, and thus the output D0 can be obtained in synchronism with the clock CK.

Figure 19:
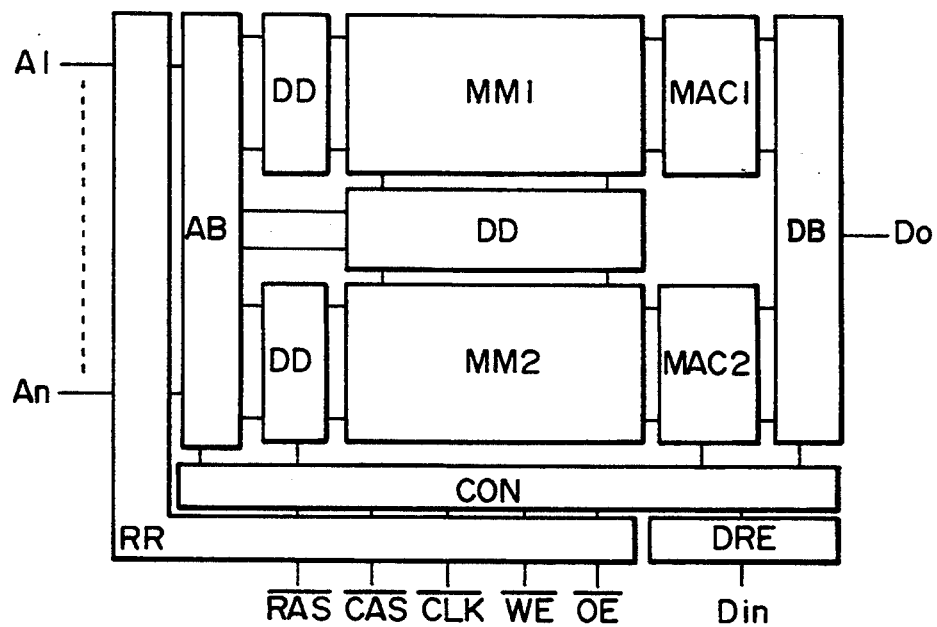
FIG. 19 is a diagram of one example of a circuit block arrangement of this invention.

FIG. 19 shows one example of the circuit block of the invention. Reference character RR represents a register for address and control signals and DRE a register for data. AB is an address buffer, DD is a decoder/driver, MM1 and MM2 are memory arrays. MAC1 and MAC2 are groups of main amplifiers which are used as caches MA1 through MAm shown in FIG. 1. The memory array has data lines connected in a hierarchical manner, and to has amplifiers for data line pairs and transfer circuits to global data lines represented by PA11 through PAmn as shown in FIG. 1 so that it occupies a small area on the chip. OB is the output circuit, and CON is a generator for various control signals. A hit/mishit detector circuit for use with caches MA1 through MAm and global data lines may be formed on the chip. /RAS, /CAS are external signals for the address signals A1 through An which specify memory cells of the memory array of two-dimensionally arranged cells. In the so-called address multiplex system, the two-dimensionally arranged address pins in the X-direction and Y-direction are used in a time-sharing manner so that the X-direction address and Y-direction address are selected by the external signals /RAS and /CAS, respectively. The signal /WE is the external signal for specifying the writing operation, and signal /OE is the external signal for directly controlling the output circuit to specify whether an output signal is fed to the output end D0. Din is input data which is sometimes formed of a plurality of pieces of information. CK is the terminal for clock signal from the MPU. When data read on the global data lines in synchronism with the clock signal or latched at the previous cycle on the global data lines used as caches together with the main amplifiers can be transferred at a high speed. Thus, according to this invention, the semiconductor device having the memory array structure used with global data lines and reduced in its occupying area can make the operation for precharging the global data lines in parallel with the memory cell selecting operation, and thus make high-speed access at the mishit time. In addition, it can realize high speed operation and reduced consumption currents by use of caches. Moreover, data from the main amplifiers MA1 through MAm can be transferred at a high speed in synchronism with the clock CK, thus realizing the high speed operation and low consumption current.

Figure 20:
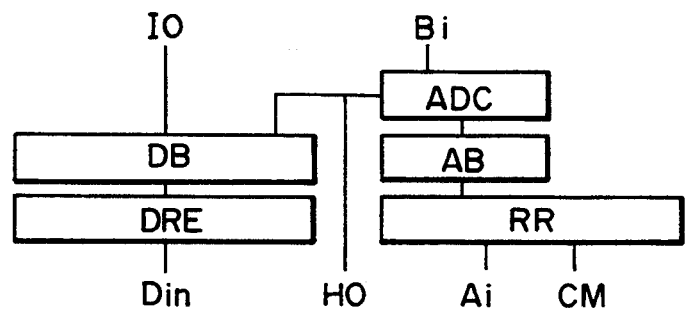
FIG. 20 is a block diagram of one example of the cache control circuit.

FIG. 20 is a block diagram of one example of the cache control circuit to be used in this invention. Ai is the address signal, and CM is the various control signals shown in FIG. 19. RR is the register for these signals, Din is the input data, and DRE is the register for this input signal. AB is the address buffer, and ADC is the decision circuit for deciding whether the input row address signal coincides with the previously input address (hit or mishit). The result of the decision is produced at HO. Bi is the address signal for decoder, and DB is the circuit for transmitting the input data of the register with its amplitude amplified suitable for the IO lines. All or part of these circuits may be provided on the same chip as the DRAM of the invention or on a separate chip. Upon reading, when a mishit signal is produced at HO, the operation shown in FIG. 2 is carried out, and when a hit signal is produced at HO, the operation shown in FIG. 3 is performed. Upon writing, the operation shown in FIG. 5 is performed irrespective of hit or mishit.

FIG. 21 shows one example of the system construction of the invention. The arrows show the direction of signals. M represents the DRAM using this invention, MPU is the processor for controlling the whole system, MCL is the controller for the high speed transfer operation and cache operation mentioned so far, RAG is the refresh address generator, TC is the control signal generator for the memory using this invention, and SLCT is the selector for switching the address signal from the CPU and the refresh address signal from the RAG. In addition, PFY is other apparatus within the system, such as external storage apparatus, display and numerical arithmetic unit, which are sometimes connected through communication networks to other information processors. DATA is the data which are transmitted between MPU and M, and CK is the clock signal for high speed transfer according to this invention. Aic is the address signal which is generated from the CPU, and Air is the refresh address signal which is generated from the RAG. Ai is the address signal which is selected by SLCT and fed to M, ST is the status signal which is fed from CPU to RAG, and BS is the busy signal which is fed from TC to CPU. SE is the signal which is supplied from TC and which actuates SLCT, and CM generally represents /RAS, /CAS, /WE, /OE shown in FIG. 19. SG indicates the transmission of signals between CPU and other apparatus within the system. The block M to which this invention is applied has data lines formed in a hierarchical manner suitable for a small area, and uses the data lines as high-speed caches. Therefore, it is possible to realize the system of a small area, small current consumption and high speed.

What is claimed is:

1. A semiconductor device comprising:
a plurality of memory cells;

data lines which are supplied with a data signal from a memory cell selected from said plurality of memory cells;

global data lines hierarchically formed together with said data lines;

switches for controlling said data lines and said global data lines to be connected to each other; and set-up means for making set-up operations for said global data lines in order that said data lines and said global data lines are electrically connected by said switches in parallel with the operation for selecting one of said memory cells;

wherein said semiconductor device and a system to which said semiconductor device is connected share a clock signal.

2. A semiconductor device according to claim 1, wherein said set-up means includes means for precharging said global data lines in parallel with the operation for selecting one of said memory cells.

3. A semiconductor device according to claim 1, wherein said switches include amplifying means for amplifying said data signal to be fed to said data lines.

4. A semiconductor device comprising:

a plurality of memory cells;

data lines which are supplied with a data signal from a memory cell selected from said plurality of memory cells;

global data lines hierarchically formed together with said data lines;

switches for controlling said data lines and said global data lines to be connected to each other; and set-up means for making set-up operations for said global data lines in order that said data lines and said global data lines are electrically connected by said switches in parallel with the operation for selecting one of said memory cells;

first writing means for previously writing said data signal on said global data lines in synchronism with a clock signal fed to said semiconductor device; and second writing means for writing in said memory cells said data signal which is previously written on said global data lines after said data lines and said global data lines are electrically connected by said switches.

5. A semiconductor device comprising:

a plurality of memory cells;

data lines which are supplied with a data signal from a memory cell selected from said plurality of memory cells;

global data lines hierarchically formed together with said data lines and which are used as cache memories switches for controlling said data lines and said global data lines to be connected to each other; and set-up means for making set-up operations for said global data lines in order that said data lines and said global data line are electrically connected by said switches in parallel with the Operation for selecting one of said memory cells;

wherein said semiconductor device and a system to which said semiconductor device is connected share a clock signal.

6. A semiconductor device according to claim 5, wherein said set-up means includes means for precharging said global data lines in parallel with the operation for selecting one of said memory cells.

7. A semiconductor device according to claim 5, wherein said switches include amplifying means for amplifying said data signal to be fed to said data lines.

8. A semiconductor device comprising:

a plurality of memory cells;

data lines which are supplied with a data signal from a memory cell selected from said plurality of memory cells;

global data lines hierarchically formed together with said data lines and which are used as cache memories;

switches for controlling said data lines and said global data lines to be connected to each other; and set-up means for making set-up operations for said global data lines in order that said data lines and said global data line are electrically connected by said switches in parallel with the operation for selecting one of said memory cells;

first writing means for previously writing said data signal on said global data lines in synchronism with a clock signal fed to said semiconductor device; and second writing means for writing in said memory cells said data signal which is previously written on said global data lines after said data lines and said global data lines are electrically connected by said switches.

9. A semiconductor device comprising:

a plurality of memory cells;

data lines which are supplied with a data signal from a memory cell selected from said plurality of memory cells;

global data lines hierarchically formed together with said data lines;

switches for controlling said data lines and said global data lines to be connected to each other;

means for holding a data signal corresponding to a data signal even after a first memory cell selecting operation, said data signal being previously fed on said global data lines from said selected memory cell in said first memory cell selecting operation; and output means for comparing a second data signal selected on said global data lines in a second memory cell selecting operation continuous to said first memory cell selecting operation with a first data signal selected on said global data lines in said first memory cell selecting operation, and, when said selected second data signal and first data signal are coincident with each other, producing said first data signal previously selected on said global data lines.

10. A semiconductor device according to claim 9, wherein said first data signal and said second data signal are compared by means of address.

11. A semiconductor device according to claim 9, wherein said semiconductor device and a system connected to said semiconductor device share a clock signal.

12. A semiconductor device according to claim 9, wherein said switches include means for amplifying said data signal fed on said data lines.

13. A semiconductor device according to claim 4, wherein said set-up means includes means for precharging said global data lines in parallel with the operation for selecting one of said memory cells.

14. A semiconductor device according to claim 4, wherein said switches include amplifying means for amplifying said data signal to be fed to said data lines.

15. A semiconductor device according to claim 8, wherein said set-up means include means for precharging said global data lines in parallel with the operation for selecting one of said memory cells.

16. A semiconductor device according to claim 8, wherein said switches include amplifying means for amplifying said data signal to be fed to said data lines.

* * * * *